United States Patent
Guo et al.

(10) Patent No.: US 10,119,048 B1
(45) Date of Patent: Nov. 6, 2018

(54) LOW-ABRASIVE CMP SLURRY COMPOSITIONS WITH TUNABLE SELECTIVITY

(71) Applicant: Rohm and Haas Electronic Materials CMP Holdings, Inc., Newark, DE (US)

(72) Inventors: Yi Guo, Newark, DE (US); David Mosley, Lafayette Hill, PA (US); Naresh Kumar Penta, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/664,544

(22) Filed: Jul. 31, 2017

(51) Int. Cl.
  *C09G 1/02* (2006.01)
  *H01L 21/3105* (2006.01)

(52) U.S. Cl.
  CPC .......... *C09G 1/02* (2013.01); *H01L 21/31053* (2013.01)

(58) Field of Classification Search
  CPC .................. C09G 1/02; H01L 21/31053
  See application file for complete search history.

(56) References Cited

U.S. PATENT DOCUMENTS

| | | | |
|---|---|---|---|
| 8,529,787 B2 | 9/2013 | Higuchi et al. | |
| 8,691,695 B2 | 4/2014 | Moeggenborg et al. | |
| 8,741,009 B2 | 6/2014 | Dysard et al. | |
| 9,524,874 B2 | 12/2016 | Venkataraman et al. | |
| 2011/0312871 A1* | 12/2011 | Miralles | C11D 3/044 510/480 |
| 2012/0066839 A1* | 3/2012 | Man | C11D 1/37 8/137 |
| 2015/0259574 A1 | 9/2015 | Grumbine et al. | |
| 2015/0376458 A1 | 12/2015 | Grumbine et al. | |

OTHER PUBLICATIONS

Fuso Chemical Co., Ltd.; Electronic Materials Pamphlet, pp. 1-2, Feb. 18, 2014.

* cited by examiner

*Primary Examiner* — Pegah Parvini
(74) *Attorney, Agent, or Firm* — Andrew Merriam; John J Piskorski

(57) ABSTRACT

The present invention provides aqueous chemical mechanical planarization (CMP) polishing compositions that comprise a mixture of one or more surfactants chosen from an amine alkoxylate, an ammonium alkoxylate, or mixtures thereof, and colloidal silica particles having at least one cationic species, the colloidal silica particles being present in the amount of from 1 to 30 wt. %, as solids based on the total weight of the composition, and the compositions having a pH ranging from 2 to 6. The surfactants have a hydrophobic tail. The CMP polishing compositions exhibit tunable oxide:polysilicon and oxide:nitride removal rate ratios and reduce both silicon nitride and polysilicon removal rates significantly without significantly reducing dielectric (e.g. TEOS) removal rates.

11 Claims, No Drawings

LOW-ABRASIVE CMP SLURRY COMPOSITIONS WITH TUNABLE SELECTIVITY

The present invention relates to aqueous chemical mechanical planarization (CMP) polishing compositions comprising a mixture of one or more surfactant having a hydrophobic alkyl or aralkyl group chosen from amine or ammonium alkoxylates and at least one dispersion of colloidal silica particles which have at least one cationic nitrogen atom, for example, aminosilane treated colloidal silica particles or, preferably, colloidal silica particles containing at least one internal cationic nitrogen atom.

In front-end-of-line (FEOL) semiconductor processing, shallow trench isolation (STI) is critical to the formation of gates, such as doped polysilicon gates, in integrated circuit fabrication, such as prior to formation of the transistors in the polysilicon. Further, interlayer dielectric (ILD) formation is critical to the formation of layer to layer or wafer scale interconnects prior to the formation of metal connections in the final semiconductor product or a layer thereof.

In STI, a dielectric such as tetraethyl orthosilicate (TEOS) or silicon dioxide is deposited in excess in trenches or isolation areas which are isolated from the remainder of an integrated circuit by capping with silicon nitride (SiN) barrier. A CMP process is then used to remove the excess dielectric, resulting in a structure in which a predetermined pattern of the dielectric is inlaid in the silicon wafer. CMP for STI requires the removal and planarization of the silicon dioxide overburden from the isolation areas and exhibits a hard stop on the nitride layer underneath, desirably resulting in consistently minimized dishing in the trenches. In subsequent processes, the silicon nitride film surfaces are cleared off by wet etching to allow the formation of isolated trenches for subsequent transistor fabrication. An acceptable oxide:nitride removal rate selectivity is necessary to prevent undesirable feature dependent non-uniformities. An acceptable oxide:polysilicon removal rate ratio is necessary to prevent damage to the underlying silicon conductive or active areas and to provide an overpolish margin to ensure all pattern densities are cleared of the oxide. Further, dishing of the oxide in any trench must be avoided to prevent low threshold voltage leaks in later-finished gates.

In poly open processes, the transistors are generally made with metal gate electrodes, requiring a CMP process that removes a dielectric layer and stops on an etch stop layer, such as a silicon nitride, to expose dummy (closed) polysilicon gate electrodes in a substantially uniform within die, within wafer or wafer to wafer topography. The dummy polysilicon gate electrode finds use in the formation of self-aligned sources and drains and for the formation of microelectronic transistors. The dummy polysilicon gate electrode may then be etched out and replaced by a high dielectric constant metal oxide electrode having desirable electrical characteristics. In part because of the shrinking size of advanced transistors, there remains a need for a precisely controlled CMP process using a tunable, highly selective oxide:polysilicon slurry which polishes through any remaining etch stop layer and/or any other structural layer, such as a hardmask, to expose a temporary component, such as a polysilicon gate, within a transistor gate.

Presently, users of aqueous chemical, mechanical planarization polishing (CMP polishing) compositions used with CMP polishing pads to polish substrates wish to use of silica containing CMP polishing compositions. Silica slurry formulations offer lower cost, defect-free solutions, but, to date, have suffered from unsatisfactory oxide dishing control and inadequate oxide:polysilicon selectivity for use in front end of the line (FEOL) applications.

U.S. patent publication no. 2015/0259574 A1, to Grumbine et al. discloses a chemical mechanical polishing composition for polishing a substrate having a tungsten layer, the composition comprising a water based liquid carrier, a colloidal silica abrasive having a permanent positive charge and a polycationic amine compound, such as a polyquaternary amine, in solution in the liquid carrier. The compositions may include an amine compound chosen from those having two to four quaternary ammonium groups. The compositions do not exhibit acceptable oxide:polysilicon selectivity for use in STI, poly open or interlayer dielectric (ILD) applications.

There remains a need to further reduce the polysilicon and nitride removal rate in CMP applications of aqueous silica slurries, such as STI and ILD applications.

The present inventors have endeavored to solve the problem of providing aqueous silica slurries which enable acceptable oxide:polysilicon selectivity for use in STI applications, as well as methods for using the slurries.

STATEMENT OF THE INVENTION

1. In accordance with the present invention, aqueous chemical mechanical planarization (CMP) polishing compositions comprising a mixture of one or more surfactants having a hydrophobic alkyl or aryl-substituted alkyl (aralkyl) group chosen from an amine alkoxylate, an ammonium alkoxylate, or mixtures thereof, and one or more dispersions of colloidal silica particles having at least one cationic nitrogen atom containing group on or internally within the particles, preferably, a dispersion of colloidal silica particles containing an internal cationic nitrogen atom group, the dispersion of colloidal silica particles being present in the amount of from 1 to 30 wt. %, or, preferably, from 10 to 24 wt. %, as solids based on the total weight of the composition, the compositions having a pH ranging from 2 to 6 or, preferably, from 3 to 5, or, more preferably, from 3.2 to 4.5, wherein at least one of the one or more dispersions of colloidal silica particles have an average zeta potential of from +5 to +50 mV, or preferably, from +10 to +30 mV.

2. The aqueous chemical mechanical planarization (CMP) polishing compositions as in item 1, wherein the one or more surfactants comprises (i) an amine alkoxylate having a hydrophobic $C_8$ to $C_{32}$ N-alkyl amine group, preferably, a $C_8$ to $C_{24}$ N-alkyl amine, and further comprising from one to two N-alkoxy ether groups or (ii) an ammonium alkoxylate having an N-alkyl ammonium group and further comprising from one to three N-alkoxy ether groups, preferably, two or three N-alkoxy ether groups, or (iii) both (i) and (ii).

3. The aqueous chemical mechanical planarization (CMP) polishing compositions as in item 2, wherein at least one of the surfactants comprises (i) an amine alkoxylate having as the $C_8$ to $C_{32}$ or, preferably, a $C_8$ to $C_{24}$ N-alkyl amine group a secondary amine, or a tertiary amine, preferably, a tertiary amine, (ii) an ammonium alkoxylate having a $C_8$ to $C_{32}$ or, preferably, a $C_8$ to $C_{24}$ N-alkyl ammonium group, or (iii) both (i) and (ii), more preferably, wherein at least one of the surfactants has two N-alkoxy ether groups and, even more preferably, wherein further the (ii) ammonium alkoxylate comprises a $C_1$ to $C_6$ N-alkyl group.

4. The aqueous chemical mechanical planarization (CMP) polishing compositions as in any one of items 2 or 3, above, wherein at least one of the amine alkoxylates, ammonium alkoxylates, or both comprises as the N-alkoxy ether group an N-ethoxy ether oligomer or N-propoxy oligomer having from 2 to 50 ether repeating units or, preferably, from 4 to 24 ether repeating units.

5. The aqueous chemical mechanical planarization (CMP) polishing compositions as in any one of items 1, 2, 3 or 4, above, wherein when the surfactant is an amine alkoxylate, the amount of the one or more amine alkoxylates ranges from 0.001 to 1 wt. % or, preferably, from 0.0025 to 0.05 wt. %, as solids based on the total weight of the composition and, when the surfactant is an ammonium alkoxylate or a mixture of surfactants containing an ammonium alkoxylate and an amine alkoxylate, the amount of the one or more ammonium alkoxylates ranges from 0.0005 to 1 wt. % or, preferably, from 0.0015 to 0.05 wt. %, as solids based on the total weight of the composition.

6. The aqueous chemical mechanical planarization (CMP) polishing compositions as in any one of items 1, 2, 3, 4 or, 5, above, wherein the composition further comprises a compound containing two quaternary ammonium groups, such as one chosen from hexabutyl $C_1$-$C_8$ alkanediammonium dihydroxides or salts thereof, such as dihalides, for example, N,N,N,N',N',N'-hexabutyl-1-6-hexanediammonium dihydroxide, preferably, N,N,N,N',N',N'-hexabutyl-1,4-butanediammonium dihydroxide (HBBAH).

7. The aqueous chemical mechanical planarization (CMP) polishing compositions as in item 6, above, wherein the amount of the compound containing two quaternary ammonium groups, as solids based on the total weight of silica solids in the composition, ranges from 1 to 2000 ppm or, preferably, from 5 to 500 ppm or, more preferably, 10 ppm to 200 ppm.

8. The aqueous chemical mechanical planarization (CMP) polishing compositions as in any one of items 1, 2, 3, 4, 5, 6, or 7, wherein the composition further comprises an aminosilane and a dispersion of colloidal silica particles contains aminosilane treated colloidal silica particles, preferably, the aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AE-APS) or N-aminoethylaminoethylaminopropyl trimethoxysilane (DEAPS aka DETAPS).

9. The aqueous chemical mechanical planarization (CMP) polishing compositions as in item 8, above, wherein the amount of the aminosilane, as solids based on the total weight of the composition, ranges from 0.0010 to 0.25 wt. %, or, preferably, from 0.003 to 0.1 wt. % or, more preferably, from 0.003 to 0.02 wt. %, based on the total silica solids in the aqueous CMP polishing compositions.

10. The aqueous chemical mechanical planarization (CMP) polishing composition as in any one of items 8 or 9, wherein in the dispersion of colloidal silica particles or any mixtures thereof 75 wt. % or more, or, preferably, from 80 to 100 wt. % of the aminosilanes are on a silica particle.

11. The aqueous chemical mechanical planarization (CMP) polishing compositions as in any one of items 1, 2, 3, 4, 5, 6, 7, 8, 9, or 10, above, wherein the dispersion of colloidal silica particles comprises spherical colloidal silica particles, or, preferably, elongated, bent or nodular colloidal silica particles, or, more preferably, mixtures thereof.

12. The aqueous chemical mechanical planarization (CMP) polishing compositions as in any one of items 1, 2, 3, 4, 5, 6, 7, 8, 9 10, or 11, above, wherein the one or more dispersions of colloidal silica particles contains elongated, bent or nodular colloidal silica particles that contain at least one cationic nitrogen atom internally or within the particle, preferably, an alkylammonium hydroxide, alkylamine, alkoxyalkyl amine, alkoxylalkyl ammonium hydroxide, arylamine or aryl ammonium hydroxide group, or a mixture thereof with a dispersion of spherical colloidal silica particles.

13. The aqueous chemical mechanical planarization (CMP) polishing compositions as in item 12, above wherein the one or more dispersions of colloidal silica particles is a mixture of a dispersion of spherical colloidal silica particles and a dispersion of elongated, bent or nodular silica particles and the amount of the elongated, bent or nodular silica particles ranges from 30 to 99.99 wt. %, or, preferably, from 40 to 90 wt. %, or, preferably, from 50 to 85 wt. %, based on the total weight of silica solids in the aqueous CMP polishing composition.

14. The aqueous chemical mechanical planarization (CMP) polishing compositions as in any one of items 1 to 13, above, further comprising a buffer, which is a carboxylate or a (di)carboxylic acid having a pKa of 3 to 7, or, preferably, a pKa of from 3 to 6, for example, in the amount of from 0 to 50 millimoles per kg (mm/kg), or, preferably, 0.1 to 10 mm/kg of total (wet) composition.

15. The aqueous chemical mechanical planarization (CMP) polishing compositions as in any of items 1 to 14, above, wherein the composition comprises no oxidizer compound.

16. In accordance with a separate aspect of the present invention, a method of making an aqueous CMP polishing composition as in any one of items 1-15, above, comprises combining an aqueous aminosilane with one or more dispersions of colloidal silica particles, or of elongated, bent or nodular colloidal silica particles, or, preferably, mixtures thereof wherein at least 30 wt. %, or, preferably, at least 50 wt. % of the silica particles contains an internal cationic nitrogen atom, the one or more dispersions containing silica solids in the amount of from 10 to 30 wt. %, or, preferably, from 15 to 24 wt. %, as solids based on the total weight of the resulting aqueous composition, and allowing it to sit for a period of from 5 to 600 minutes, such as up to 120 minutes, then, adjusting the pH of the resulting aqueous composition to from 2 to 6 or, preferably, from 3 to 5 with an acid, such as a (di)carboxylic acid, a strong acid, or a salt thereof while shearing to form an aqueous silica slurry; shearing the resulting pH adjusted aqueous composition to form an aminosilane group containing colloidal silica composition; and, combining the aminosilane group containing colloidal silica composition with one or more amine alkoxylates, ammonium alkoxylates, or mixtures thereof and, if desired, a compound containing two quaternary ammonium groups to make the aqueous CMP polishing composition.

16. The method of making an aqueous CMP polishing composition as in item 15, wherein the CMP polishing composition comprises one or more an amine alkoxylate surfactant comprising a hydrophobic $C_8$ to $C_{32}$ N-alkyl amine group, preferably, a $C_8$ to $C_{24}$ N-alkyl amine group which is a secondary amine, a tertiary amine or comprises an ammonium alkoxylate surfactant having a $C_8$ to $C_{32}$ N-alkyl ammonium group, or both, and, wherein any amine alkoxylate surfactant comprises from one to two N-alkoxy ether groups, such as an N-ethoxy ether oligomer or N-propoxy oligomer having from 2 to 50 ether repeating units or, preferably, from 4 to 24 ether repeating units, and any ammonium alkoxylate surfactant comprises from one to three, preferably, two or three N-alkoxy ether groups, such as an N-ethoxy ether oligomer or N-propoxy oligomer having from 2 to 50 ether repeating units or, preferably, from 4 to 24 ether repeating units.

17. The method of making an aqueous CMP polishing composition as in any one of items 15 or 16, wherein the aqueous aminosilane comprises an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AEAPS) or N-aminoethylaminoethylaminopropyl trimethoxysilane (DEAPS aka DETAPS).

18. The method of making an aqueous CMP polishing composition as in any one of items 15, 16 or 17, wherein the compound containing two quaternary ammonium groups, is chosen from hexabutyl $C_1$-$C_8$ alkanediammonium dihydroxides or salts thereof, such as dihalides, preferably N,N,N,N',N',N'-hexabutyl-1,4-butanediammonium dihydroxide (HBBAH).

19. The method of making an aqueous CMP polishing composition as in any one of items 15 to 18, above, wherein before combining it with the one or more aqueous dispersions of colloidal silica particles, the method comprises adjusting the pH of the aqueous aminosilane to from 3.5 to 8 with a (di)carboxylic acid or a strong acid, or salt thereof and letting it sit for a period of from 10 to 180 minutes to hydrolyze any silicate bonds in the aminosilane and form a hydrolyzed aqueous aminosilane containing one or more cationic nitrogen atoms per aminosilane molecule.

20. The method of making an aqueous CMP polishing composition as in any one of items 15 to 19, further comprising diluting the aqueous CMP polishing composition to a total silica content of from 1 to 10 wt. %, based on the total weight of the composition.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly) amine" refers to amine, polyamine, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "cationic nitrogen atom" refers to a quaternary ammonium nitrogen or an amine nitrogen in an aqueous composition where the pH of the solution is below the pKa of the protonated form of the amine.

As used herein, the term "colloidally stable" means that a given composition does not gel or precipitate, and remains clear upon visible inspection after a given time and at a given temperature.

As used herein, the term "hard base" refers to metal hydroxides, including alkali(ne earth) metal hydroxides, such as NaOH, KOH, or $Ca(OH)_2$.

As used herein, the term "ISO" refers to publications of the International Organization for Standardization, Geneva, CH.

A used herein, the term "not substantially removed" means that, for silicon nitride, the amount of the material removed expressed as a thickness of that material removed is 200 Å or less, or, preferably, 150 Å or less and, that, for silicon oxide or dielectric in a trench feature, the amount of the material removed expressed as a thickness of that material removed is 250 Å or less, or, preferably, 215 Å or less.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "silica particle solids" or "silica solids" means, for a given composition, the total amount of positively charged silica particles, plus the total amount of negatively charged silica particles, plus the total amount of any other silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a pKa of 2 or less, such as inorganic acids like sulfuric or nitric acid.

As used herein, the term "use conditions" means the temperature and pressure at which a given composition is used, including increases in temperature and pressure during use.

As used herein, the term "weight fraction silica" means the total wt. % of silica, based on the total weight of the composition/100%. Thus, 30 wt. % silica equates to a weight fraction of 0.3.

As used herein, the term "wt. %" stands for weight percent.

As used herein, the term "zeta potential" refers to the charge of a given composition as measured by a Malvern Zetasizer instrument. All zeta potential measurements were made on (diluted) slurry compositions as described in the examples. The reported value was taken from an averaged measurement of zeta values using >20 acquisitions taken by the instrument for each indicated composition.

The present inventors have discovered that acidic aqueous silica particle slurries containing amine or ammonium alkoxylate surfactants having a hydrophobic amine group and one or more N-alkoxylate chain connected to the amine nitrogen suppress the removal rates (RR) of polysilicon and silicon nitrides (SiN) simultaneously. The addition of these surfactants suppressed polysilicon RR by one order of magnitude (10×) and reduced SiN RR by up to 50% depending on the surfactant concentration. In addition, the aqueous slurry composition in accordance with the present invention is stable against visible precipitation or sedimentation at a 15 wt. % solids content for several days. In contrast, prior known additives used to suppress polysilicon removal rates have been anionic surfactants, which are not compatible with slurries comprising cationic abrasives or low pH slurries wherein any materials are below their isoelectric points and therefore have a positive charge or a positive potential. To suppress silicon nitride and polysilicon removal rates simultaneously, known additives, such as polypropylene glycol or amino silane and polyacrylic acid, are not compatible with each other in colloidal stability and gel or they contradict each other in polishing performance when combined. In accordance with the present invention, amine alkoxylate surfactants reduce both silicon nitride and polysilicon removal rates significantly without significantly reducing dielectric (e.g. TEOS) removal rates.

In accordance with the present invention, suitable amine alkoxylates comprise, for example, fatty amines which have been N-alkoxylated. For example, a suitable amine alkoxylate comprises octadecylamine which has been ethoxylated with three ethoxylate oligomers to yield a quaternary N,N,N tri(oligo)ethoxy octadecylammonium compound.

Suitable amine alkoxylates in accordance with the present invention may be an amine alkoxylate having any of the following two structures:

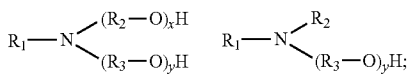

wherein, $R_1$ is a $C_8$-$C_{32}$ alkyl group; $R_2$ and $R_3$ are each, independently, a $C_2$-$C_4$ n-alkyl, sec-alkyl, iso-alkyl, or tert-alkyl groups; and x and y are integers such that each of x and y is from 2-50.

Suitable amine alkoxylates in accordance with the present invention may be an diamine alkoxylate having any of the following structures:

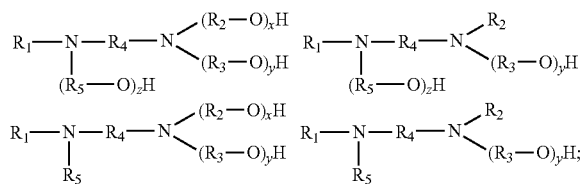

wherein, $R_1$ is a $C_8$-$C_{32}$ alkyl group; $R_2$, $R_3$, $R_4$ and $R_5$ are each, independently, a $C_2$-$C_4$ n-alkyl, sec-alkyl, iso-alkyl, or tert-alkyl groups; and x, y and z are integers such that each x, y and z is from 2-50.

Suitable ammonium alkoxylates in accordance with the present invention may have any of the following structures:

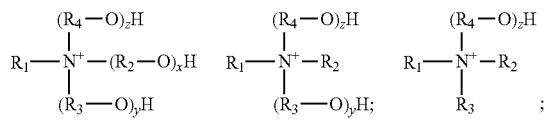

wherein, $R_1$ is a $C_8$-$C_{32}$ alkyl group; $R_2$, $R_3$ and $R_4$ are each, independently, a $C_2$-$C_4$ n-alkyl, sec-alkyl, iso-alkyl, or tert-alkyl group; and x, y and z are integers such that each of x, y and z is from 2-50.

In accordance with the present invention, suitable colloidal silica compositions may comprise a dispersion of silica made by conventional sol gel polymerization or by the suspension polymerization of water glass. Such silica dispersions may take any form, such as spherical or elongated, bent or nodular silica particles.

Preferably, the silica compositions of the present invention comprise a mixture of a dispersion of spherical colloidal silica particles and a dispersion of elongated, bent or nodular silica particles.

Preferably, at least one or both of the dispersions of spherical colloidal silica particles and of the elongated, bent or nodular silica particles contains a cationic nitrogen atom within the silica particle. More preferably, the colloidal silica particle compositions of the present invention can be mixture of a dispersion of elongated, bent or nodular silica particles that contains a cationic nitrogen atom group and a dispersion of spherical colloidal silica particles.

Suitable dispersions of elongated, bent or nodular silica particles are made from suspension polymerization by hydrolytic condensation of silanols formed in a known manner from conventional precursors like tetraethoxysilane (TEOS) or tetramethoxysilane (TMOS). Processes for making the elongated, bent or nodular silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkylamines, alkoxyalkyl amines, such as ethoxypropylamine (EOPA), or KOH, preferably, tetramethylammonium hydroxide; the hydrolytic condensation process may incorporate internally one or more cationic nitrogen atoms into the elongated, bent or nodular silica particles. Preferably, the elongated, bent or nodular silica particles are cationic at a pH of 4.

Spherical aqueous colloidal silica dispersions may also be formed from hydrolytic condensation of conventional precursors like tetraethoxysilane (TEOS) or tetramethoxysilane (TMOS) in the presence of a basic catalyst, such as an alkylammonium hydroxides, alkylamines, alkoxyalkyl amines, such as ethoxypropylamine (EOPA), or KOH, preferably, tetramethylammonium hydroxide; the hydrolytic condensation process may incorporate one or more cationic nitrogen atoms or other cationic species into the silica particles. Spherical colloidal silica is formed in a less involved process than elongated, bent or nodular silica particles, where pH is slowly raised to form the silica particles.

Preferably, at least one cationic nitrogen atom in the dispersion of silica particles, i.e. thedispersion of elongated, bent or nodular silica particles comes from a basic catalyst, such as an alkylammonium hydroxides, alkylamines, alkoxyalkyl amines, alkoxyalkyl ammonium hydroxides, aryl amines or aryl ammonium hydroxides. Such a colloidal silica particle composition has an internal cationic nitrogen atom.

Suitable dispersions of bent or nodular silica particles are available from Fuso Chemical Co., Ltd., Osaka, JP (Fuso) under the tradenames HL-2, HL-3, HL-4, PL-2, PL-3, PL-3C or BS-2 and BS-3 slurries. The HL and BS series particles from Fuso contain one or more nitrogen atoms which impart a cationic charge at pH 4. Such nitrogen atoms are contained in alkylammonium hydroxide, alkylamine, alkoxyalkyl amine, or alkoxyalkyl ammonium hydroxide groups.

Suitable dispersions of bent or nodular silica particles that do not contain an internal nitrogen include, for example, Klebosol™ 1630 slurries (Dow Chemical Co., Midland, Mich.). The silica particle dispersions in the aqueous chemical mechanical planarization (CMP) polishing compositions of the present invention may have a z-average particle size (CPS) ranging from 10 nm to 250 nm, or, preferably, from 12 nm to 150 nm.

In accordance with the compositions of the present invention, aminosilanes are used in amounts such that more aminosilane is used with smaller silica particles (that have more surface area) and less aminosilane is used with larger silica particles. Suitable amounts of the aminosilane range from 0.0020 to 0.25 wt. %, or, preferably, from 0.003 to 0.1 wt. % or, more preferably, from 0.003 to 0.02 wt. %, based on the total silica solids in the aqueous CMP polishing compositions. Aminosilane (ammonium silane) compounds may at the pH of the compositions of the present invention physisorb onto silica particle surfaces due to electrostatic attraction with the particle surface. They can then react with the silica surface by a condensation reaction, forming Si—O—Si bonds. In general, at least 75 wt. % of any aminosilane compound will be bonded to the silica surface, i.e. not freely floating in the continuous aqueous phase.

The dispersions of colloidal silica particles in the CMP polishing compositions of the present invention have a positive zeta potential, or, if a mixture of two or more dispersions of colloidal silica particles, a positive average zeta potential. For controlling colloidal stability, the number of cationic nitrogen atoms in the aminosilane per unit surface area of the silica particles in the pH range of less than 5 should remain low and yet cause the silica particles to have a positive zeta potential. However, too many cationic nitrogen atoms per surface area of silica particles can lead to a loss in polishing ability of the slurry, as measured by removal rates of TEOS wafers. The number of cationic nitrogen atoms to a unit of silica surface area is also a function of the porosity, density, and silanol concentration of the silica particle surface; more aminosilane would be needed for more porous or less dense silica particles as well as for silica having more silanol groups on its surface. It is well known in the art that the silanol density for silica particles in water varies from 1.8-2 silanols/nm$^2$ of surface area to as much as 7-8 silanols/nm$^2$, based on surface areas measured by a BET measurement.

Aminosilanes can improve the colloidal stability of the compositions of the present invention relates; such stability can relate to the presence of positive charged atoms or cations. Tertiary and secondary aminosilanes having one amine group contribute one positive charge or cationic nitrogen atom per aminosilane molecule at the pH of the present invention (2 to 6) because the amino group is protonated. Bis(amino) silanes and aminosilanes containing two amine groups, such as N-(2-aminoethyl)-3-aminopropylsilanes contribute approximately 2 positive charges or cationic nitrogen atoms per aminosilane molecule at the pH of the compositions of the present invention.

Suitable aminosilanes for use in making an aminosilane group containing silica particle dispersions of the present invention are tertiary amine group and secondary amine group containing aminosilanes. The aminosilanes in the compositions of the present invention are present as hydrolyzed aqueous aminosilanes during initial mixing, but quickly become sorbed on the surface of the silica particles.

Suitable aminosilanes for use in the aqueous CMP polishing compositions of the present invention comprise an aminosilane containing one or more tertiary amine group, such as N,N-(diethylaminomethyl)triethoxysilane (DEAMS), or one or more secondary amine group, such as N-(2-aminoethyl)-3-aminopropyltrimethoxysilane (AE-APS) or N-aminoethylaminoethylaminopropyl trimethoxysilane (DEAPS aka DETAPS).

In accordance with the hydrolyzed aqueous aminosilane of the present invention and methods for making the CMP polishing compositions containing them, an aqueous aminosilane composition is allowed to sit so as to hydrolyze any silicate bonds formed on storage. For aminosilanes containing one or more secondary amine groups, the pH of such aqueous aminosilanes is maintained at from 7 to 8 for from 5 to 600 minutes, such as for 5 to 120 minutes, before the pH is adjusted to from 3.5 to 5 with a strong acid. The tertiary amine group containing aminosilanes are more readily hydrolyzed at the desired pH range of the aqueous silica CMP polishing compositions of the present invention (pH 3 to 5) than are primary and secondary amine group containing aminosilanes. A small percentage of the aminosilanes may exist as short chain oligomers after the hydrolysis step.

As aminosilanes having one or more secondary amine groups are less preferred, methods using them comprise making a hydrolyzed aqueous aminosilane comprises adjusting the pH of the aqueous aminosilane of the present invention having one or more tertiary amino group, to a pH of from 3.5 to 4.5 and allowing it to sit for from 5 to 600 minutes or from 5 to 120 minutes.

In accordance with the present invention, suitable amounts of aminosilanes may range from 0.0010 to 0.25 wt. %, or, preferably, from 0.003 to 0.1 wt. % or, more preferably, from 0.003 to 0.02 wt. %, based on the total silica solids in the aqueous CMP polishing compositions.

In accordance with the present invention, suitable compounds containing two quaternary ammonium groups may comprise N,N,N,N',N',N'-hexabutyl-1,4-butanediammonium dihydroxide (HBBAH). Such compounds enhance the stability of the aqueous CMP polishing compositions for storage, shipment and heat aging while maintaining a high removal rate.

In accordance with the present invention, suitable compounds containing two quaternary ammonium groups may comprise hexabutyl $C_1$-$C_8$ alkanediammonium dihydroxides or salts thereof, such as dihalides, or, preferably, N,N,N,N',N',N'-hexabutyl-1,4-butanediammonium dihydroxide (HBBAH).

In accordance with the present invention, suitable amounts of the compound containing two quaternary ammonium groups ranges from 1 to 2000 ppm or, preferably, from 5 to 500 ppm or, more preferably, 10 ppm to 200 ppm, based on the total weight of silica solids, in the composition. The amount should be sufficient to ensure a stabilizing effect. More of the compound containing two quaternary ammonium groups is needed to stabilize concentrates and compositions having a higher silica concentration and/or a lower aminosilane concentration. More is also need to stabilize smaller average size particles owing to their increased surface area and potential for oligomerization or gelling.

In accordance with the present invention, suitable amounts of the compound containing two quaternary ammonium groups ranges from 5 to 2000 ppm or, preferably, from 10 to 2000 ppm of a slurry having a silica solids content of from 1 to 30 wt. % or, preferably, from 10 to 24 wt. %. The amount should be sufficient to ensure a stabilizing effect. More of the compound containing two quaternary ammonium groups is needed to stabilize concentrates and compositions having a higher silica concentration and/or a lower aminosilane concentration. More is also need to stabilize smaller average size particles owing to their increased surface area and potential for oligomerization or gelling.

To ensure colloidal stability of the aqueous CMP polishing compositions of the present invention, the compositions have a pH ranging from 2 to 6, or, preferably, from 3 to 5 or, more preferably, from 3.2 to 4.5. The compositions tend to lose their stability above the desired pH range.

The aqueous chemical mechanical planarization (CMP) polishing compositions in accordance with the present invention find use in polishing dielectrics or oxide containing substrates, wherein the compositions comprise no oxidizer compound, such as peracids, peroxides, iron oxides or iodate salts.

The CMP polishing in accordance with the present invention comprises a conventional CMP polishing method. The CMP polishing comprises: Providing a CMP polishing apparatus having a platen or table; providing the substrate to be polished, such as a silicon or polysilicon substrate on which is deposited a layer of a dielectric, such as silicon dioxide, and, preferably, on which is also deposited a layer of silicon nitride; providing a CMP polishing pad, such as a polyurethane foam pad, having a polishing surface; installing onto the platen or table the CMP polishing pad; providing the aqueous CMP polishing composition of the present invention at an interface between a polishing surface of the CMP polishing pad and the substrate; and, creating dynamic contact between the CMP polishing pad surface and the substrate until the layer of polysilicon, preferably and any silicon nitride, is exposed but not substantially removed, preferably, such that the dielectric or silicon oxide remaining in any low areas or trenches is approximately level with the edges of the polysilicon and any silicon nitride.

In accordance with the methods of the present invention, the methods comprise CMP polishing wherein the creating dynamic contact between the CMP polishing pad surface and the substrate can be by rotating the substrate, rotating the CMP polishing pad having the polishing layer, or rotating both.

In accordance with the methods of the present invention, the methods comprise: CMP polishing with a CMP polishing pad and, separately or at the same time, conditioning the polishing surface of the CMP polishing pad with a conditioning pad so that it has a surface microtexture.

In accordance with the present invention, the substrate comprises polysilicon, as well as silicon dioxide or tetraethyl orthosilicate (TEOS) and, preferably also comprises silicon nitrides, as SiN or $Si_3N_4$ or their mixtures, and the polishing results in an oxide:polysilicon removal rate ratio of at least 3:1, for example, from 3:1 to 25:1 or, preferably, from 8:1 to 20:1, for example, at least 8:1 and, preferably an oxide:nitride removal rate ratio of from 2:1 to 10:1. The oxide:polysilicon removal rate ratio and the oxide:nitride removal rate ratio can be tuned, such as increased by including more of the ammonium alkoxylate or amine alkoxylate surfactant.

Desirably, the CMP polishing of the present invention is carried out in STI or ILD processing with the CMP polishing composition of the invention, preferably such that the polysilicon and any silicon nitride is not substantially removed and the silicon dioxide is adequately planarized without excessive erosion or dishing of dielectric or silicon dioxide within the trenches or any other low areas.

In use, STI processing of a wafer substrate involves providing a silicon substrate on which is deposited a layer of silicon nitride. Following photolithography, trenches are etched onto the substrate comprising an overlying layer of silicon nitride, and an excess of dielectric, for example, silicon dioxide, is deposited thereon. The substrate is then subjected to planarization until the surface layer of silicon nitride is exposed but not substantially removed, such that the dielectric or silicon oxide remaining in the trenches is approximately level with the edges of the silicon nitride.

In use, ILD or bulk dielectric processing of a wafer substrate involves providing a feature containing silicon substrate having doped silicon active features with low areas between them and silicon nitride trenches therein and on which is deposited a layer of a filling layer of dielectric, such as silicon dioxide or TEOS. The substrate is then subjected to planarization until the surface layer of silicon and silicon nitride is exposed but not substantially removed, such that the dielectric or silicon oxide remaining in the low areas and trenches is approximately level with the edges of the silicon features and the silicon nitride.

EXAMPLES

The following examples illustrate the various features of the present invention.

In the Examples that follow, unless otherwise indicated, conditions of temperature and pressure are ambient temperature and standard pressure.

The following materials were used in the Examples that follow: Diquat or HBBAH=N,N,N,N',N',N'-hexabutyl-1,4-butanediammonium dihydroxide (Sachem, Austin, Tex.);

DEAMS=(N,N-diethylaminomethyl)triethoxysilane, 98%, Gelest Inc.);

Quaternary amine alkoxylate: Ethoquad™ C/25 cocoalkylmethyl ethoxylated (15) quaternary ammonium salt (CAS: 61791-10-4) (Akzo Nobel, Tarrytown, N.Y.)

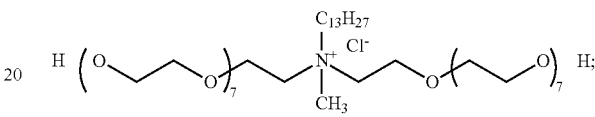

Amine alkoxylate 1: Ethomeen™ 18/12 ethoxylated (2) octadecylamine having a tertiary amine (CAS: 10213-78-2, Akzo Nobel);

Amine alkoxylate 2: Ethomeen™ C/25: Ethoxylated™ (15) cocoalkylamine having a tertiary amine (CAS: 61791-14-8, Akzo Nobel);

Diamine alkoxylate: Ethoduomeen™ T-25 ethoxylated (15) N-tallow-1,3-diaminopropane (CAS: 61790-85-0, Akzo Nobel); and, CTAC: Cetyltrimethylammonium chloride.

The various silica particles used in the Examples are listed in Table A, below.

TABLE A

| Silica particles | | | | |
|---|---|---|---|---|
| Aqueous Silica Slurry | Source | pH | Nominal $SSA^2$ ($m^2/g$) | Concentration (wt. % solids) | Particle size (CPS, nm) |
| Slurry A | Klebosol ™ [1]1598-625 | 7.7 | 110 | 30 | 38 |
| Slurry B | BS-3[3] | 7.3 | — | 20 | 53 |

[1]Merck KgAA, Darmstadt, Germany. All particles are spherical and produced from sodium silicate raw materials.
[2]Reported specific surface areas from Merck KgAA for each product, not lot specific;
[3]Elongated particles having a cationic nitrogen made from an alkoxyalkyl amine catalyst, Fuso Chemical Co., Ltd., Osaka, JP.

The following abbreviations were used in the Examples that follow:

POU: Point of use; RR: Removal rate; SA: Surface Area; SSA: Specific surface area.

Unless otherwise indicated in the following examples, a slurry was formulated from a 3:1 mixture, by weight, as solids, of the elongated, bent or nodular silica particles in Slurry B and the silica particles of Slurry A, each from Table A, above, as a 15 wt. % solids slurry composition. About 0.08 wt. % solids of DEAMS solution of aminosilane in water at pH ~7.5 was added to the indicated silica particle slurry composition to form amine-treated colloidal silica particles. The pH of the slurry was maintained at ~7.5 for 1 hr. The resulting composition comprises about 90 wt. % of silica particles containing the aminosilane on the particle. The compositions were combined with the 0.00625 wt. % as solids of Diquat and, unless otherwise indicated, were aged at room temperature. The silica slurry composition was were adjusted to the indicated pH using succinic acid.

If only a single Slurry A or Slurry B is indicated in the following examples, then it is used starting as a 15 wt. % solids composition and the indicated silica particle slurry was combined with DEAMS, as above.

Formulation Examples

The above formulation was diluted to 2 weight % solids and combined with the indicated surfactants to give aqueous CMP polishing compositions, as in Tables B and C, below. The formulations in Table D, below, are handled the same way as in the formulation, above, except that in the formulations in Table D, below, only one of Slurry A or Slurry B is formulated and tested at a time. The formulations in Table E, below were handled the same way as in the formulation in Table D, below, except that the formulations did not contain aminosilane or Diquat. At POU, the tested slurries exhibited a positive zeta potential.

ml/min. A Saesol 8031C1 diamond pad conditioner (Saesol Diamond Ind. co., ltd., Korea) was used to condition the polishing pad. The CMP polishing pad was broken in with the pad conditioner using a down force of 6.35 kg (14.0 lb) for 20 minutes and was then further conditioned prior to polishing using a down force of 4.1 kg (9 lb) for 10 minutes. The CMP polishing pad was further conditioned in situ during polishing at 10 sweeps/min from the center of the polishing pad with a down force of 4.1 kg (9 lb). The removal rates were determined by measuring the film thickness before and after polishing using a KLA-Tencor F5X metrology tool (KLA Tencor, Milpitas, Calif.) using a 49 point spiral scan with a 3 mm edge exclusion.

Z-Average Particle Size:

The Z-Average particle size of the indicated composition was measured by Dynamic Light Scattering (DLS) using a Malvern Zetasizer device (Malvern Instruments, Malvern, UK) calibrated per manufacturers recommendations. The z-Avg particle size is the intensity-weighted harmonic mean

TABLE B

CMP Polishing Compositions
(All proportion units are pbw, as solids)

| Example | Amine-surface treated colloidal silica* | Amine alkoxylate 1 | Amine alkoxylate 2 | Quaternary ammonium alkoxylate | Polypropylene glycol (Mw~400) | Final pH | pH Titrant |
|---|---|---|---|---|---|---|---|
| 1 (Comparative) | 2 | | | | | 4.5 | Succinic Acid |
| 2 | 2 | 0.0033 | | | | 4.5 | Succinic Acid |
| 3 (Comparative) | 2 | | 0.0007 | | | 4.5 | Succinic Acid |
| 4 | 2 | | 0.0033 | | | 4.5 | Succinic Acid |
| 5 | 2 | | 0.0167 | | | 4.5 | Succinic Acid |
| 6 | 2 | | 0.0033 | | | 4 | Succinic Acid |
| 7 | 2 | | | 0.0007 | | 4.5 | Succinic Acid |
| 8 | 2 | | | 0.0033 | | 4.5 | Succinic Acid |
| 9 | 2 | | | 0.0167 | | 4.5 | Succinic Acid |
| 10 (Comparative) | 2 | | | | 0.0067 | 4.5 | Succinic Acid |
| 11 (Comparative) | 2 | | | | 0.0333 | 4.5 | Succinic Acid |
| 12 (Comparative) | 2 | | | | 0.0333 | 4.5 | Succinic Acid |

*3:1 solids wt. Slurry B to Slurry A.

The following test methods were used in the Examples that follow:

pH at POU:

The pH at point of use (pH at POU) was that measured during removal rate testing after dilution of the indicated concentrate compositions with water to the indicated solids content.

Removal Rate:

Removal rate testing from polishing on the indicated substrate was performed using an Applied Materials Reflexion™ 300 mm polishing machine or "Reflexion RR" (Applied Materials, Santa Clara, Calif.), as indicated, at the indicated downforce and table and carrier revolution rates (rpm), and with the indicated CMP polishing pad and abrasive slurry at a given abrasive slurry flow rate 300 size, which is a diameter, as calculated by an ISO method. (ISO13321:1996 or its newer pendant ISO22412:2008). Measurements of particle size were done on diluted particle samples at pHs as described in each example.

Zeta Potential:

Zeta potential of the indicated compositions was measured by a Malvern Zetasizer instrument in the manner defined above. Measurements of zeta potential were done on compositions diluted to 2% w/w silica with a pH 4.5 solution, the compositions at or near a pH of 4.5.

Removal Rate Testing:

The slurry concentrates were diluted to 2% w/w in water for removal rate testing with no subsequent pH adjustment. Unless otherwise indicated an AMAT Reflexion™ LK polisher (Applied Materials, Santa Clara, Calif.) at a downforce of 6.9 kPa (1 psi) and 20.7 kPa (3 psi) with a table speed of 93 rpm, and a substrate carrier speed of 87 rpm. To test performance, TEOS/SiN/Poly-Si wafers were polished at a flow rate of 300 mL/min. Unless otherwise indicated, an 101000™ urethane pad 80 mils thick with a shore D hardness of 57 (The Dow Chemical Company, Midland, Mich., (Dow)) having a $K7+R_{32}$ groove pattern was used.

Example 1: Effects of Amine Ethoxylates on Removal Rate

Removal rate testing of the slurry compositions indicated in Table B, above, is indicated in Table 1, below.

TABLE 1

Removal Rate Testing

| | 6.9 kPa | | | 20.7 kPa | | |
|---|---|---|---|---|---|---|
| Example | TEOS RR | SiN RR | Poly-Si RR | TEOS RR | SiN RR | Poly-Si RR |
| 1 (Comparative) | 1240 | 36 | 362 | 3214 | 138 | 1579 |
| 2 | 1180 | 17 | N/A | 3199 | 118 | 851 |
| 3 (Comparative) | 1192 | 23 | 190 | 3286 | 127 | 1448 |
| 4 | 1182 | 25 | 29 | 3137 | 122 | 105 |
| 5 | 1087 | 25 | 20 | 3060 | 108 | 132 |
| 6 | 1102 | 15 | 26 | 3005 | 80 | 129 |
| 7 | 1099 | 26 | N/A | 3235 | 131 | 1028 |
| 8 | 1069 | 25 | N/A | 3160 | 114 | 148 |
| 9 | 1003 | 23 | N/A | 3059 | 111 | 41 |
| 10 (Comparative) | 1054 | N/A[1] | 44 | 3092 | 149 | 118 |
| 11 (Comparative) | 1025 | N/A[1] | 47 | 3041 | 139 | 100 |
| 12 (Comparative) | 1042 | N/A[1] | 74 | 3060 | 138 | 110 |

[1]N/A = not tested.

As shown in above Table 1, addition of inventive amine alkoxylate surfactants, the silicon nitride (SiN) and polysilicon (Poly-SI) removal rates (RR) are reduced up to 60% reduction in SiN and up to 95% reduction in Poly-Si. As shown in Examples 3, 4, 5, 6, 7, 8 and 9, the Poly-Si RR was reduced by the amine alkoxylate, such as the preferred quaternary ammonium alkoxylate, depending on their concentration. SiN RR was not so concentration dependent but was consistently observed, especially at a pH of 4 in Example 6. The comparative poly (propylene glycol) additives exhibited some level of suppression on Poly-Si RR but did not lower SiN RR as compared to the control (Comparative Example 1).

Example 2: Polishing Removal Rate Results Versus Cationic Surfactant

Further removal rate testing of the Compositions indicated in Table C, below, is indicated in Table 2, below. Formulations were made in the same manner as above with a 3:1 solids weight blend of Slurry B:Slurry A. Removal rate was tested as indicated, above.

TABLE C

More Formulations
(All proportion units are pbw, as solids)

| Example | Amine-surface treated colloidal silica 3:1 B to A | Amine alkoxylate 2 | CTAC | Final pH | pH Titrant |
|---|---|---|---|---|---|
| 13 (Comparative) | 2 | | | 4 | Succinic Acid |
| 14 (Comparative) | 2 | | 0.0033 | 4 | Succinic Acid |
| 15 | 2 | 0.0033 | | 4 | Succinic Acid |

TABLE 2

Removal Rate Performance

| | 6.9 kPa | | | 20.7 kPa | | |
|---|---|---|---|---|---|---|
| Example | TEOS RR | SiN RR | Poly-Si RR | TEOS RR | SiN RR | Poly-Si RR |
| 13 (Comparative) | 1167 | 24 | 212 | 3104 | 119 | 963 |
| 14 (Comparative) | 1105 | 18 | 185 | 3089 | 74 | 908 |
| 15 | 1139 | 19 | 29 | 3095 | 80 | 189 |

As shown in Table 2, above, a cationic surfactant CTAC ($C_{16}$ alkyl tail) which doesn't contain alkoxylated side chains in Comparative Example 14 exhibited acceptable SiN RR suppression but not Poly-Si RR suppression.

Example 3: Polishing Removal Rate Results with Single Colloidal Silica Compositions Slurries were formulated as above, except with only a single silica composition in each formulation. Further removal rate testing of the Compositions indicated in Table D, below, is indicated in Table 3, below. Removal rate was tested as indicated above.

TABLE D

Single Colloidal Silica Formulations
(All proportion units are pbw, as solids)

| Example | Amine-surface treated Slurry A | Amine-surface treated Slurry B | Amine alkoxylate 2 | Final pH | pH Titrant |
|---|---|---|---|---|---|
| 16 (Comparative) | | 2 | | 4.5 | Succinic Acid |
| 17 (Comparative) | 2 | | | 4.5 | Succinic Acid |
| 18 | | 2 | 0.0050 | 4.5 | Succinic Acid |
| 19 | 2 | | 0.0050 | 4.5 | Succinic Acid |

TABLE 3

Removal Rate Performance

| | 6.9 kPa | | | 20.7 kPa | | |
|---|---|---|---|---|---|---|
| Example | TEOS RR | SiN RR | Poly-Si RR | TEOS RR | SiN RR | Poly-Si RR |
| 16 (Comparative) | 1375 | 29 | 391 | 3867 | 141 | 1721 |
| 17 (Comparative) | 997 | 16 | 398 | 2165 | 128 | 1555 |
| 18 | 1304 | 21 | 15 | 3765 | 125 | 33 |
| 19 | 910 | 12 | 13 | 2065 | 99 | 115 |

As shown in Table 3, above, the same particles without the amine alkoxylate in Comparative Examples 16 and 17 exhibited acceptable SiN RR suppression but not Poly-Si RR suppression. Compare side by side Examples 18 and 16 (Comp) as well as Examples 19 and 17 (Comp). Each of the inventive Slurries A and B in Examples 18 and 19 exhibited both SiN and Poly-Si RR suppression. The preferred Example 18 composition performed the best, as it has a colloidal silica composition of elongated, bent or nodular silica particles which have an internal cationic nitrogen atoms.

Example 4: Polishing Removal Rate Results without a Diquaternary Ammonium Compound or Aminosilane and with a Single Colloidal Silica Composition Slurries were formulated from the elongated, bent or nodular silica particles having internal cationic nitrogen atoms in Slurry B from Table A, above, as a 15 wt. % solids slurry composition but without amino silane treatment. The silica slurry compositions were adjusted to the pH indicated using nitric acid.

Further removal rate testing of the Compositions indicated in Table E, below, is indicated in Table 4, below. Removal rate was tested as indicated above.

TABLE E

Formulations without Aminosilane

| Example | Slurry B | Quaternary amine alkoxylate | Final pH | pH Titrant |
|---|---|---|---|---|
| 20 (Comparative) | 2 | | 3.5 | Nitric Acid |
| 21 | 2 | 0.0025 | 3.5 | Nitric Acid |
| 22 | 2 | 0.0050 | 3.5 | Nitric Acid |

TABLE 4

Removal Rate Performance

| | 20.7 kPa Downforce | | |
|---|---|---|---|
| Example | TEOS RR | SiN RR | Poly-Si RR |
| 20 (Comparative) | 3224 | 176 | 147 |
| 21 | 3438 | 147 | 120 |
| 22 | 3500 | 127 | 31 |

The inventive formulations containing the quaternary amine alkoxylate surfactant give improved removal rate and oxide:nitride selectivity and dramatically improved oxide:polysilicon selectivity. All improvements are dosage dependent on the presence of the quaternary amine alkoxylate.

Example 5: Polishing Removal Rate Results without a Diquaternary Ammonium Compound or Aminosilane Slurries were formulated from the 3:1 solids weight mixture of Slurry B:Slurry A from Table A, above, as a 15 wt. % solids slurry composition but without amino silane treatment. The silica slurry compositions were adjusted to the pH indicated using succinic acid.

Further removal rate testing of the Compositions indicated in Table F, below, is indicated in Table 5, below. Removal rate was tested as indicated above.

TABLE F

Formulations without Diquaternary Ammonium Compounds

| Example | Aminosilane-treated silica 3:1 B to A | Diamine alkoxylate | Final pH | pH Titrant |
|---|---|---|---|---|
| 23 (Comparative) | 2 | | 4.5 | Succinic Acid |
| 24 | 2 | 0.0025 | 4.5 | Succinic Acid |
| 25 | 2 | 0.0050 | 4.5 | Succinic Acid |

TABLE 5

Removal Rate Performance

| | 20.7 kPa Downforce | | |
|---|---|---|---|
| Example | TEOS RR | SiN RR | Poly-Si RR |
| 23 (Comparative) | 3233 | 154 | 1863 |
| 24 | 3251 | 147 | 725 |
| 25 | 3170 | 106 | 445 |

The inventive formulations containing the diamine alkoxylate surfactant give similar removal rate and similar to improved oxide:nitride selectivity as well as dramatically improved oxide:polysilicon selectivity. All improvements are dosage dependent on the presence of the diamine alkoxylate.

We claim:

1. An aqueous chemical mechanical planarization (CMP) polishing composition comprising a mixture of one or more surfactants having a hydrophobic alkyl or aryl-substituted alkyl (aralkyl) group chosen from an amine alkoxylate, an ammonium alkoxylate, or mixtures thereof, and one or more dispersions of colloidal silica particles having at least one cationic nitrogen atom containing group on or within the colloidal silica particles, the one or more dispersions of colloidal silica particles being present in the amount of from 1 to 30 wt. %, as solids based on the total weight of the composition, the compositions having a pH ranging from 2 to 6, and wherein at least one of the one or more dispersions of colloidal silica particles has a zeta potential of from +5 to +50 mV.

2. The aqueous chemical mechanical planarization (CMP) polishing composition as claimed in claim 1, wherein the one or more surfactants comprises (i) an amine alkoxylate having a hydrophobic $C_8$ to $C_{32}$ N-alkyl amine and further comprising from one to two N-alkoxy ether groups, or (ii) an ammonium alkoxylate having an N-alkyl ammonium group and further comprising from one to three N-alkoxy ether groups, or (iii) both (i) and (ii).

3. The aqueous chemical mechanical planarization (CMP) polishing composition as claimed in claim 2, wherein at least one of the surfactants comprises as the N-alkoxy ether group an N-ethoxy ether oligomer or N-propoxy oligomer having from 2 to 50 ether repeating units.

4. The aqueous chemical mechanical planarization (CMP) polishing composition as claimed in claim 1, wherein when the one or more surfactants comprises an amine alkoxylate, the amount of the one or more amine alkoxylates ranges from 0.001 to 1 wt. %, as solids based on the total weight of the composition, and, when the surfactant is an ammonium alkoxylate or a mixture of surfactants containing an ammonium alkoxylate and an amine alkoxylate, the amount of the one or more ammonium alkoxylates ranges from 0.0005 to 1 wt. %, as solids based on the total weight of the composition.

5. The aqueous chemical mechanical planarization (CMP) polishing composition as claimed in claim 1, wherein the composition further comprises a compound containing two quaternary ammonium groups.

6. The aqueous chemical mechanical planarization (CMP) polishing composition as claimed in claim 5, wherein the compound containing two quaternary ammonium groups is chosen from hexabutyl $C_1$-$C_8$ alkanediammonium dihydroxides or salts thereof.

7. The aqueous chemical mechanical planarization (CMP) polishing composition as claimed in claim 1, wherein the composition further comprises an aminosilane and the colloidal silica particle is an aminosilane treated colloidal silica particle, and wherein in the dispersion of colloidal silica particles or any mixtures thereof 75 wt. % or more of the aminosilanes are on a silica particle.

8. The aqueous chemical mechanical planarization (CMP) polishing composition as claimed in claim 1, wherein the colloidal silica particles are elongated, bent or nodular colloidal silica particles that contain at least one cationic nitrogen atom internally or within the particle.

9. The aqueous chemical mechanical planarization (CMP) polishing composition as claimed in claim 8, wherein the colloidal silica particles are a mixture of spherical colloidal silica particles and elongated, bent or nodular silica particles and the amount of the elongated, bent or nodular silica particles ranges from 30 to 90 wt. %, based on the total weight of silica solids in the aqueous CMP polishing composition.

10. The aqueous chemical mechanical planarization (CMP) polishing composition as claimed in claim 1, wherein the composition comprises no oxidizer compound.

11. The aqueous chemical mechanical planarization (CMP) polishing composition of claim 8, wherein the at least one cationic nitrogen atom internally or within the particle is provided by an alkylammonium hydroxide, alkylamine, alkoxyalkyl amine, alkoxyalkyl ammonium hydroxide, arylamine or aryl ammonium hydroxide group.

* * * * *